United States Patent
Cui et al.

[11] Patent Number: 5,965,463
[45] Date of Patent: Oct. 12, 1999

[54] SILANE ETCHING PROCESS

[75] Inventors: Chunshi Cui, Santa Clara; Robert W. Wu, Pleasanton; Gerald Zheyao Yin, Cupertino, all of Calif.

[73] Assignee: Applied Materials, Inc., Santa Clara, Calif.

[21] Appl. No.: 08/888,370

[22] Filed: Jul. 3, 1997

[51] Int. Cl.$^6$ .................................................. H01L 21/00
[52] U.S. Cl. ........................ 438/723; 438/743; 156/345
[58] Field of Search ................... 216/67, 79, 59; 438/710, 714, 723, 738, 740, 743, 8, 9, 14; 156/345 MT

[56] References Cited

U.S. PATENT DOCUMENTS

| | | | |
|---|---|---|---|
| 4,213,818 | 7/1980 | Lemons et al. | 156/643 |
| 5,266,154 | 11/1993 | Tatsumi | 156/643 |
| 5,312,518 | 5/1994 | Kadomura | 156/662 |
| 5,354,421 | 10/1994 | Tatsumi et al. | 156/662 |
| 5,423,945 | 6/1995 | Marks et al. | 156/662.1 |
| 5,477,975 | 12/1995 | Rice et al. | 216/68 |
| 5,556,501 | 9/1996 | Collins et al. | 156/345 |

FOREIGN PATENT DOCUMENTS

| | | |
|---|---|---|
| 552 491 A1 | 12/1992 | European Pat. Off. . |
| 552 490 A1 | 7/1993 | European Pat. Off. . |

*Primary Examiner*—William Powell
*Attorney, Agent, or Firm*—Charles Guenzer

[57] ABSTRACT

A low-temperature process for selectively etching oxide with high selectivity over silicon in a high-density plasma reactor. The principal etching gas is a hydrogen-free fluorocarbon, such as $C_2F_6$ or $C_4F_8$, to which is added a silane or similar silicon-bearing gas, e.g., the monosilane $SiH_4$. The fluorocarbon and silane are added in a ratio within the range of 2 to 5, preferably 2.5 to 3. The process provides high polysilicon selectivity, high photoresist facet selectivity, and steep profile angles. Selectivity is enhanced by operating at high flow rates. Silicon tetrafluoride may be added to enhance the oxide etching rate. The process may operate at temperatures of chamber parts below 180° C. and even down to 120° C. The process enables the fabrication of a bi-level contact structure with a wide process window.

26 Claims, 9 Drawing Sheets

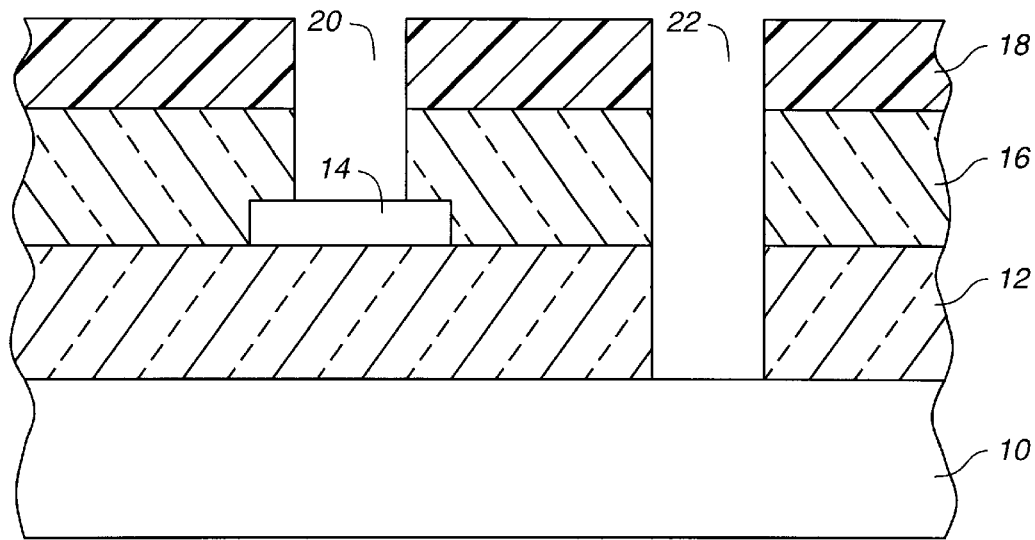
FIG._1
(PRIOR ART)
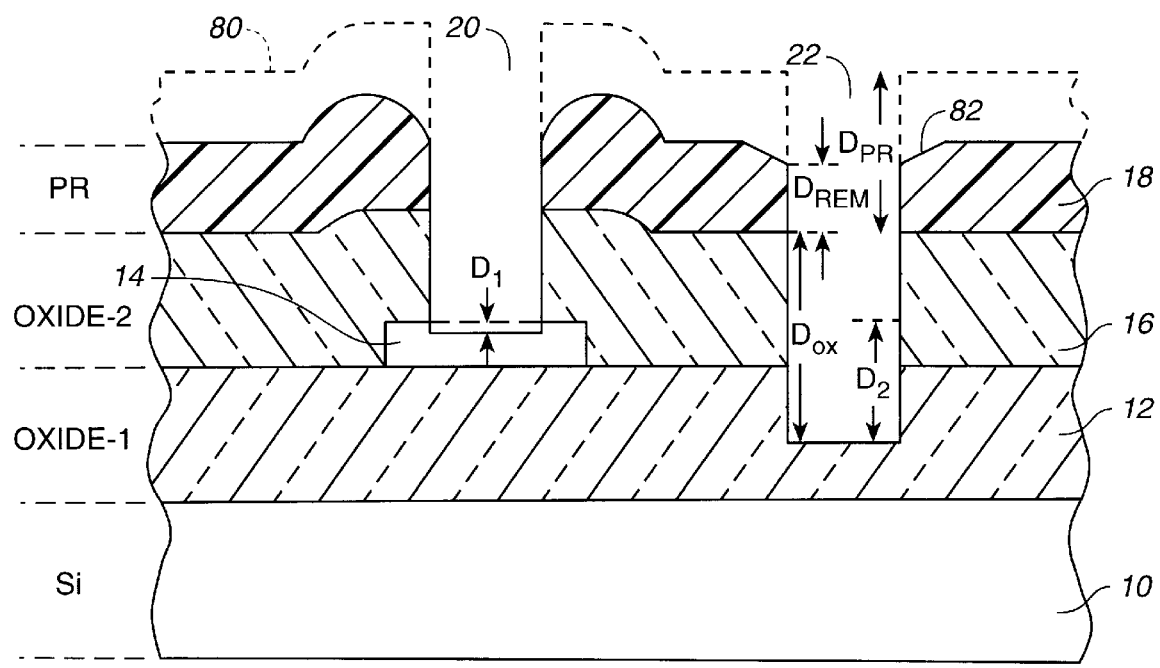
FIG._5

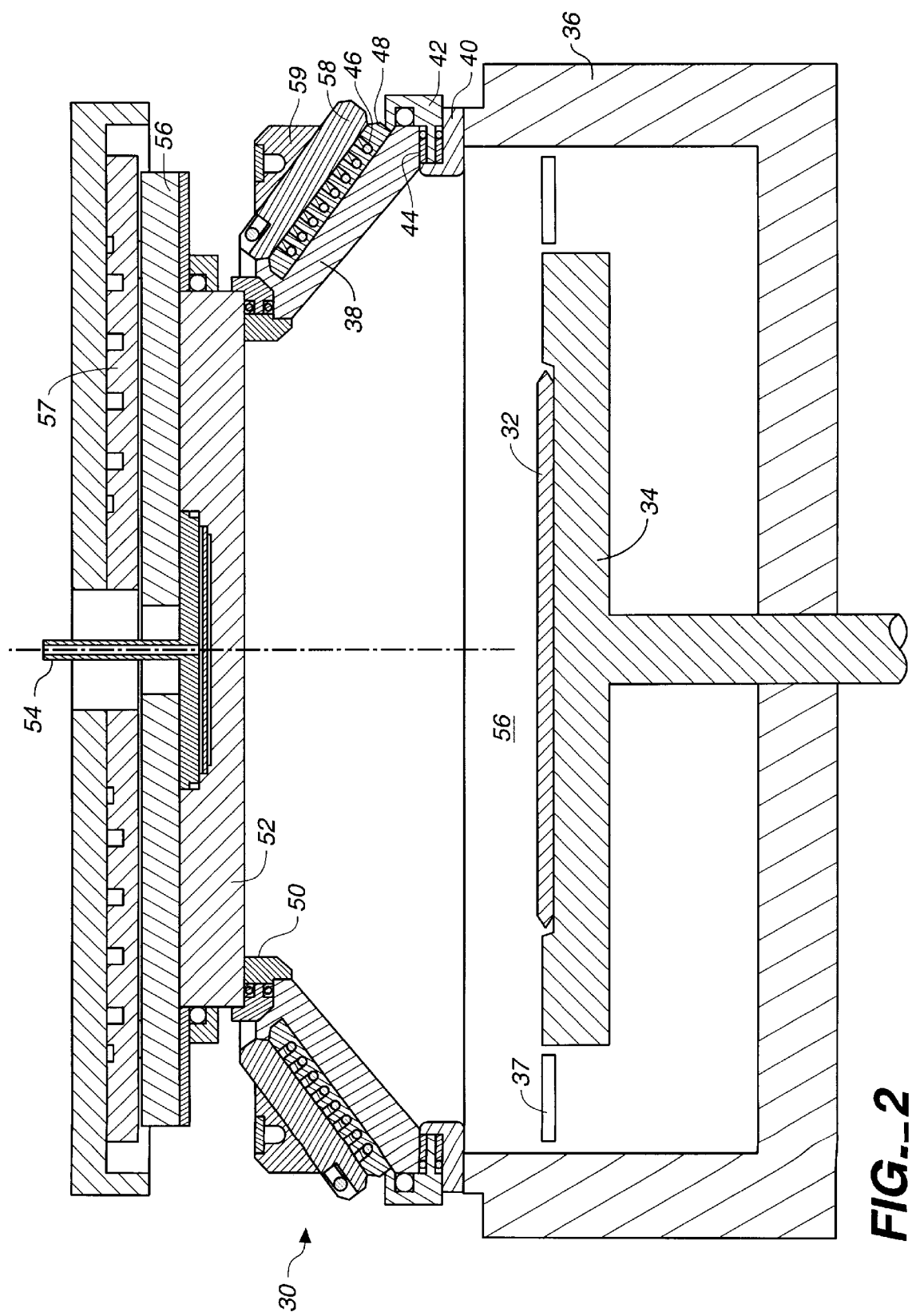
FIG._2

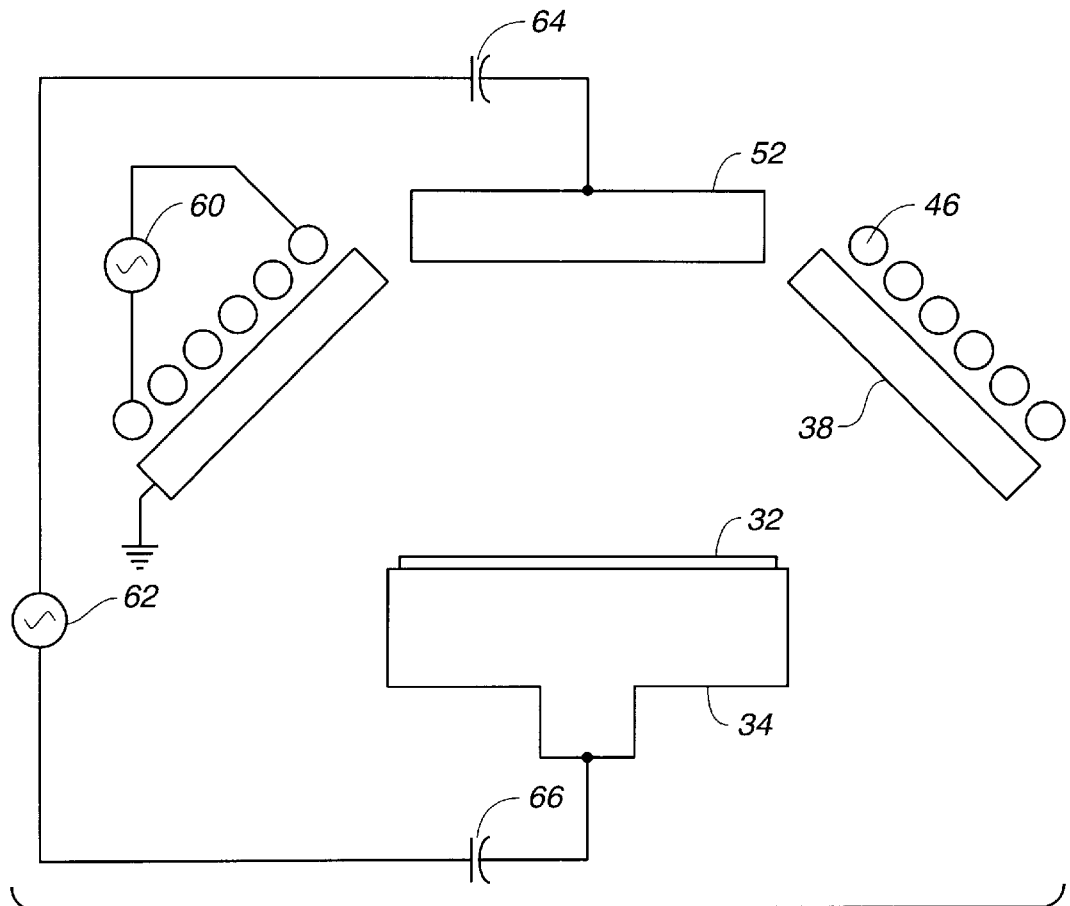
FIG._3
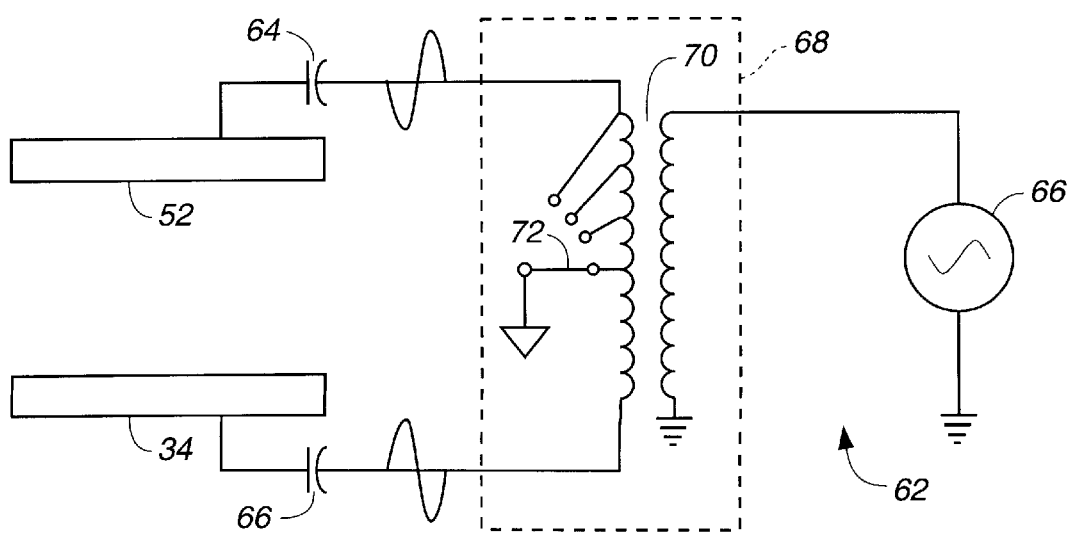
FIG._4

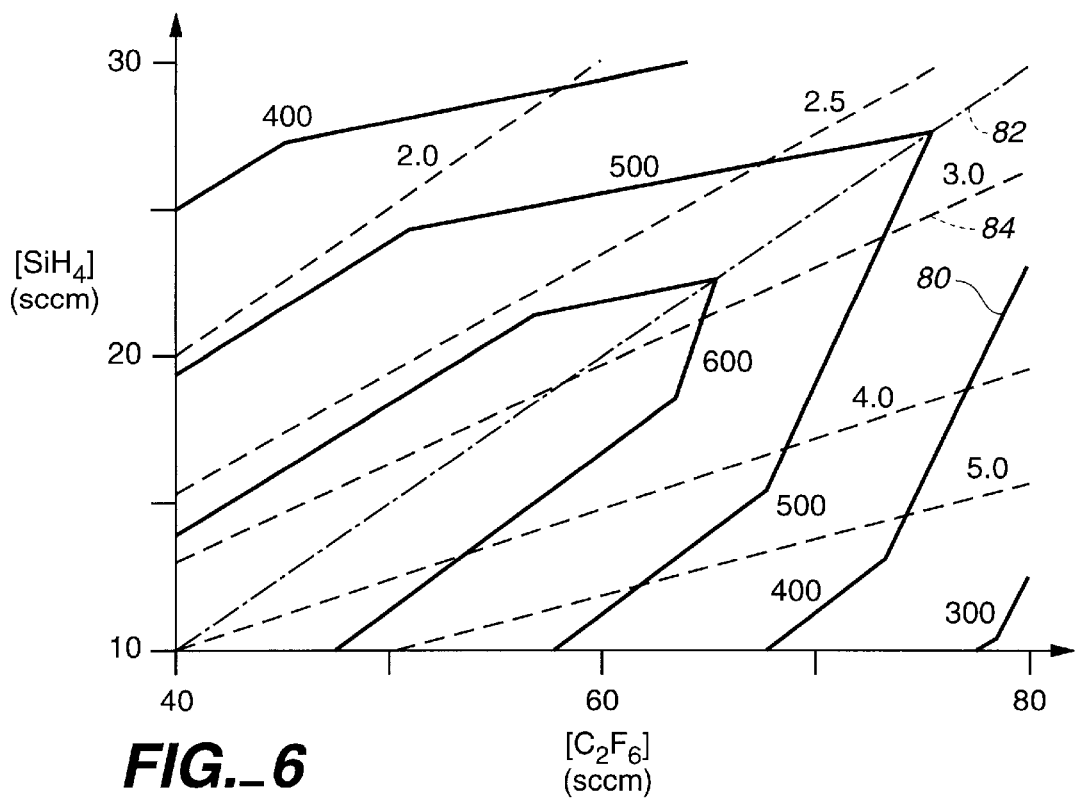
FIG._6
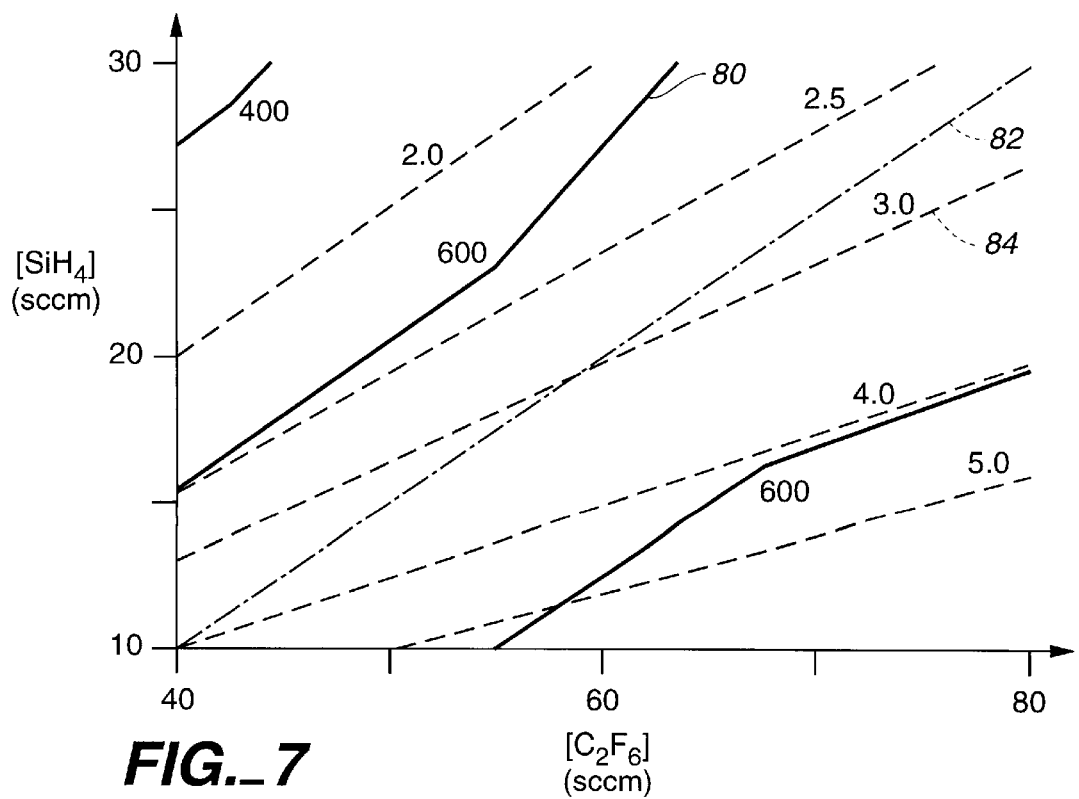
FIG._7

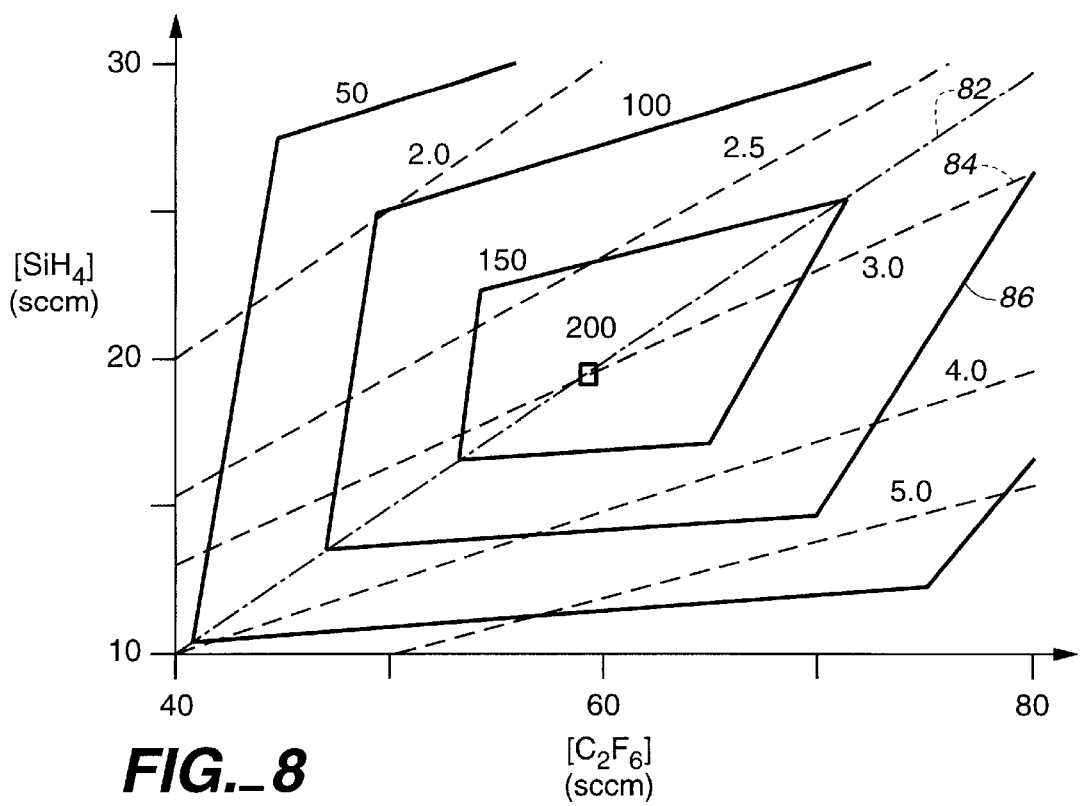
FIG._8
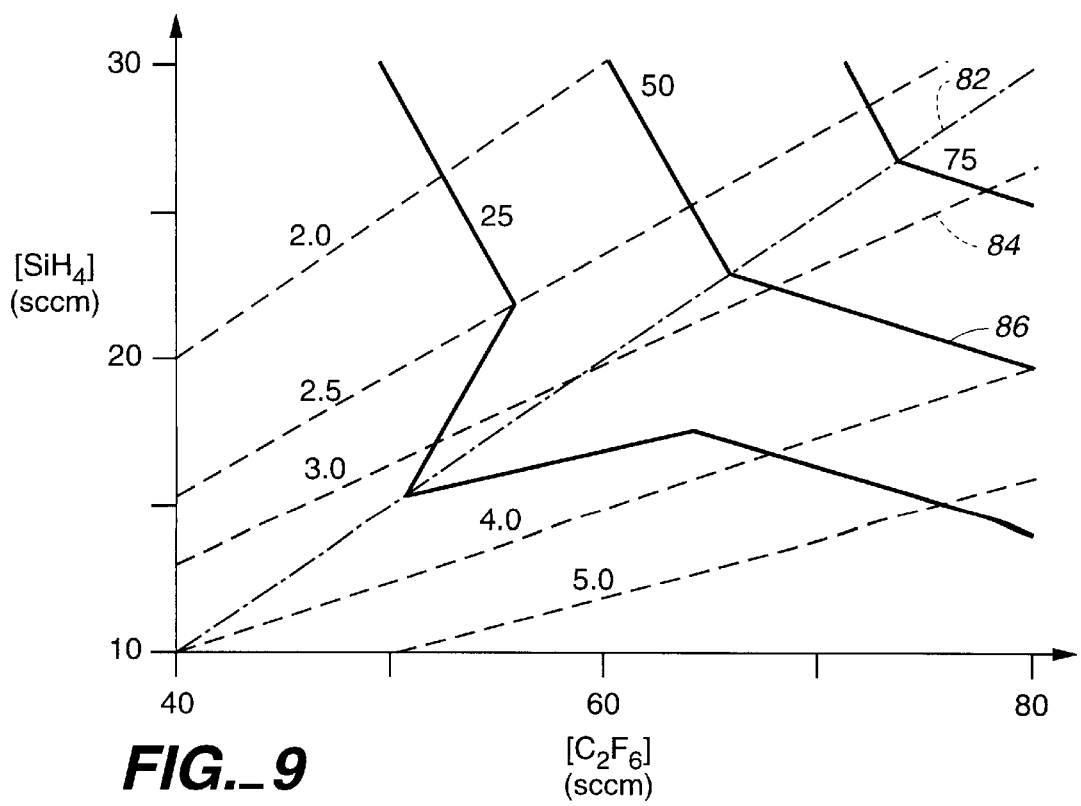
FIG._9

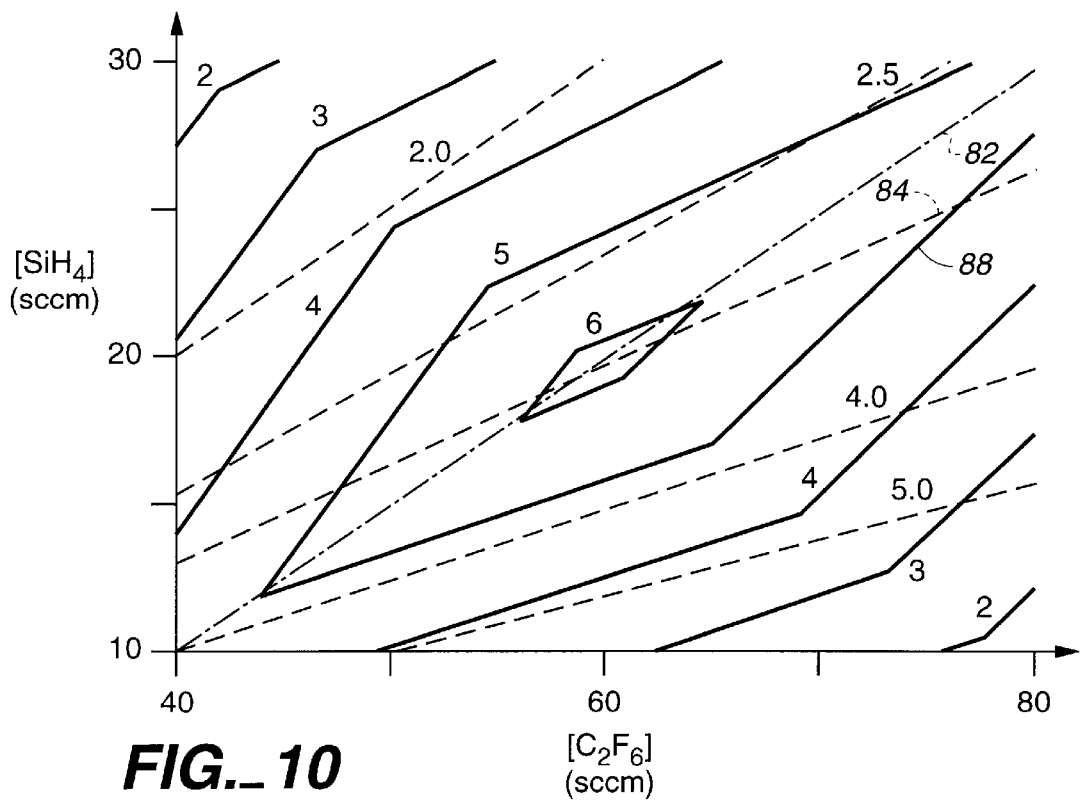
FIG._10
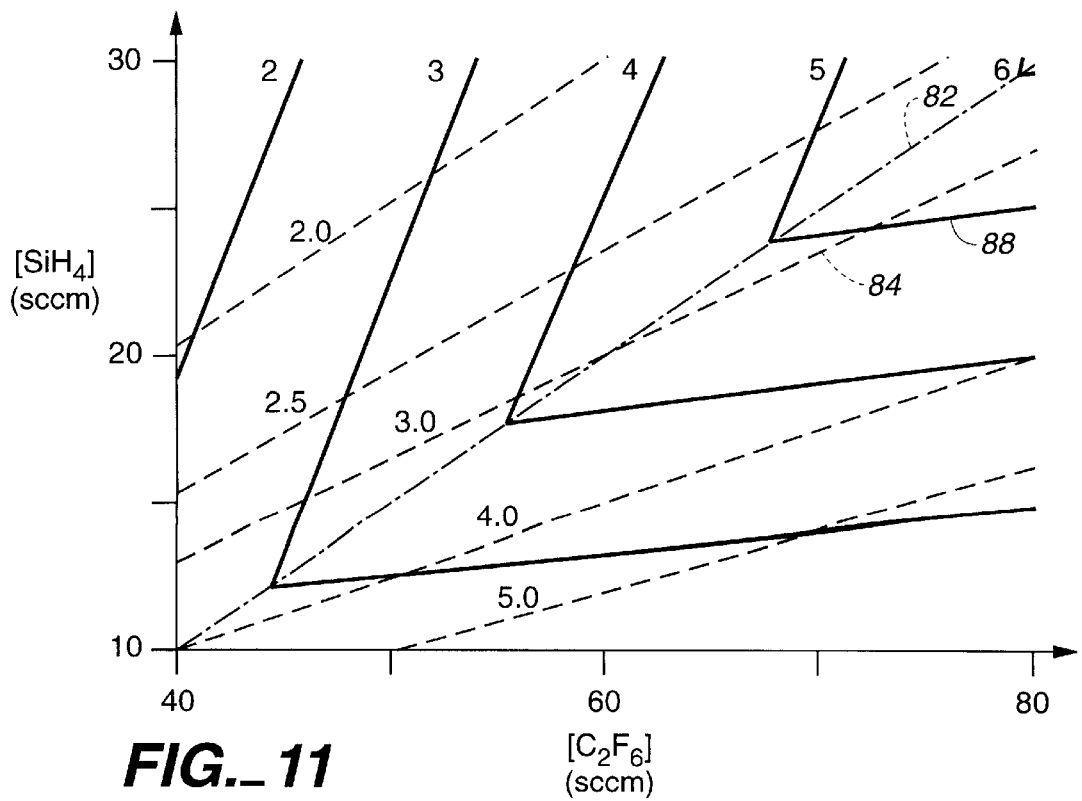
FIG._11

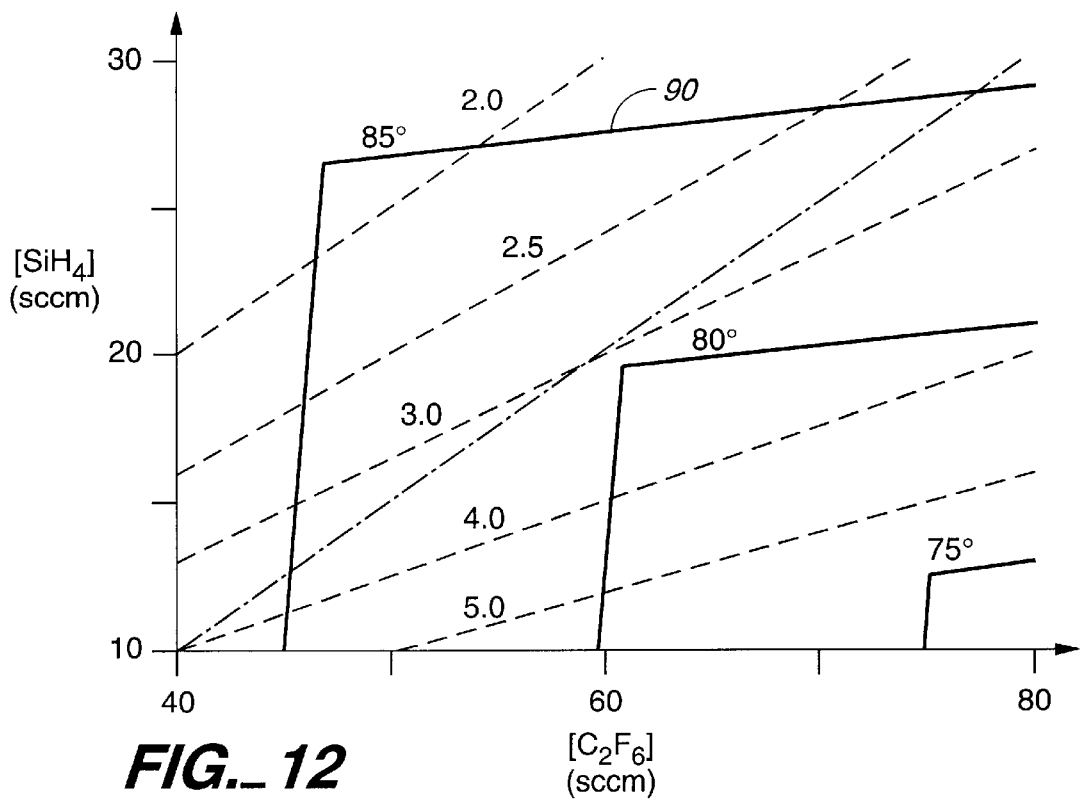
FIG._12
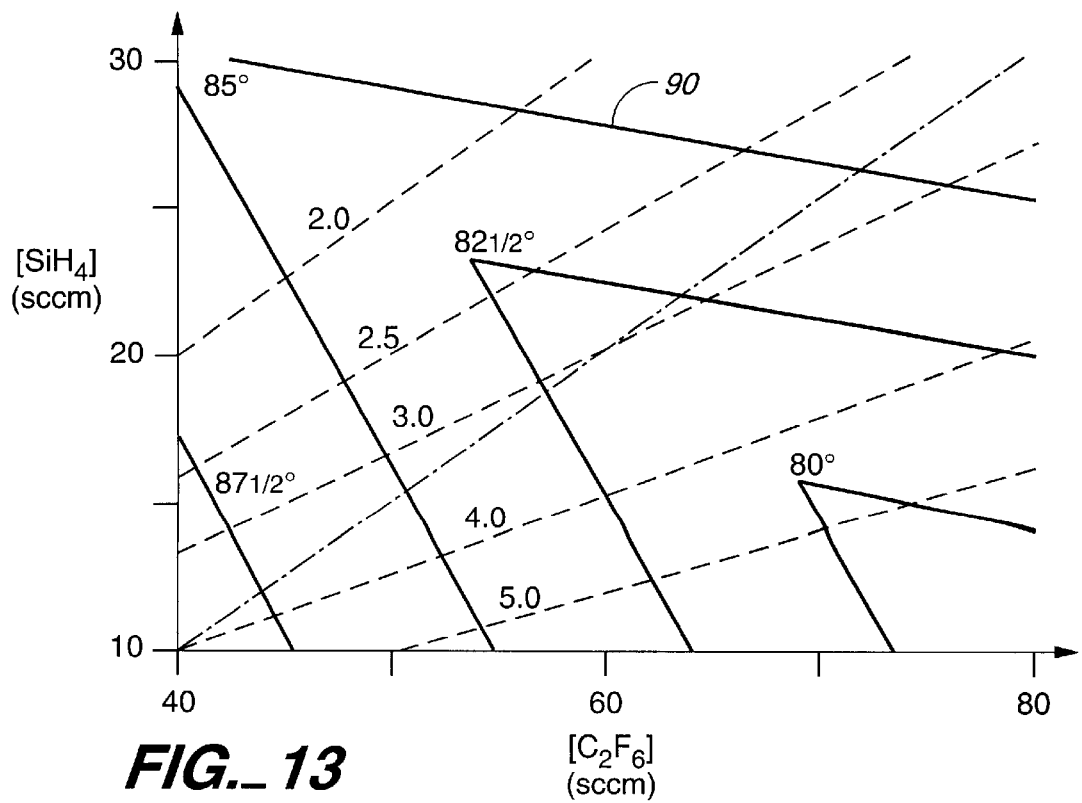
FIG._13

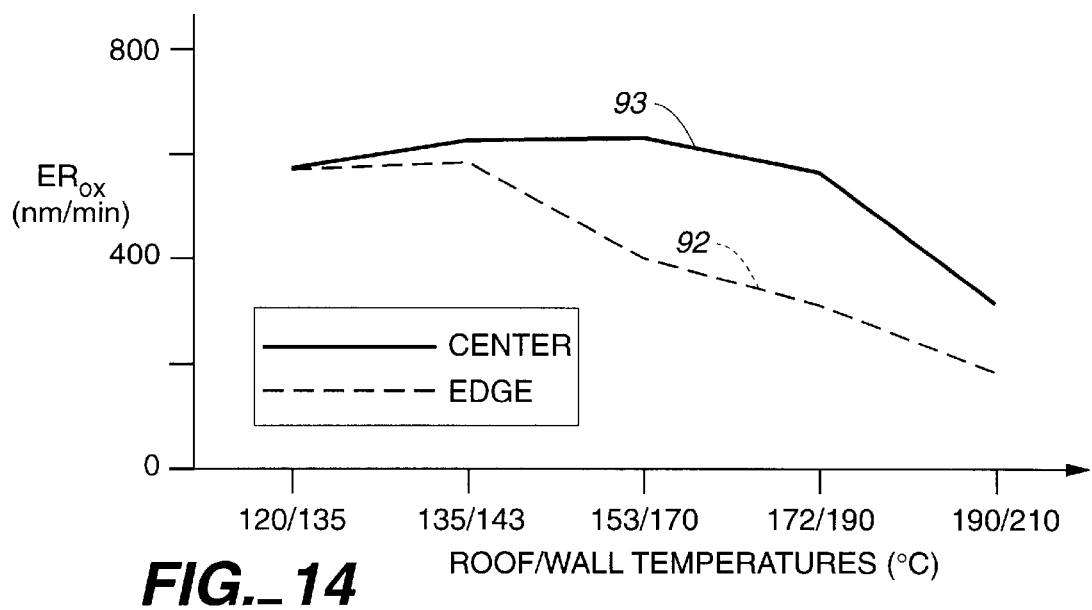
FIG._14
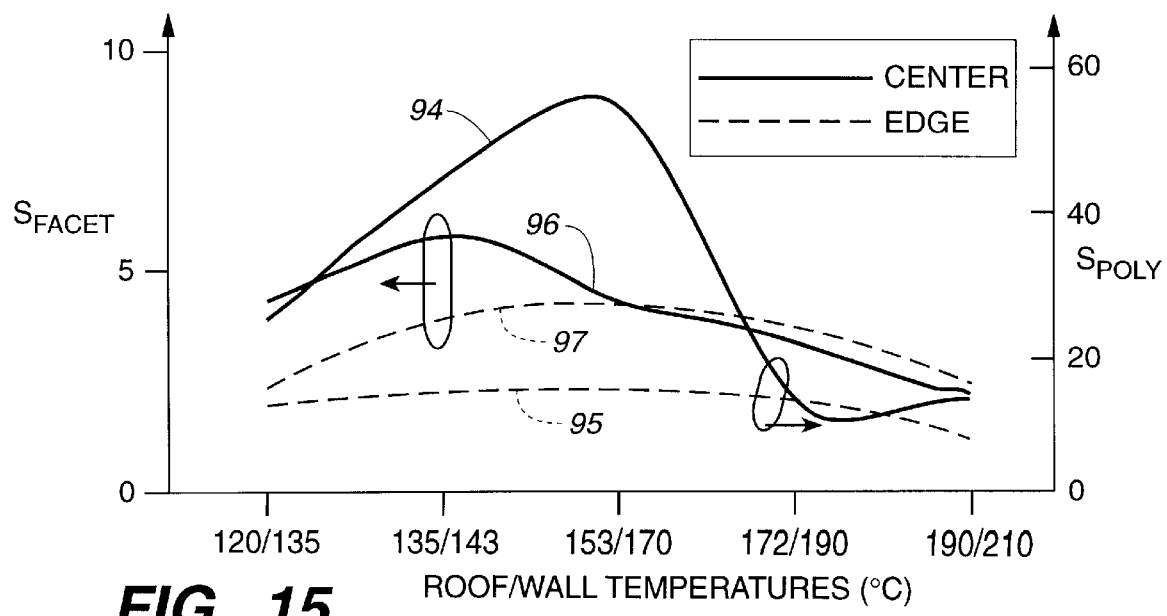
FIG._15

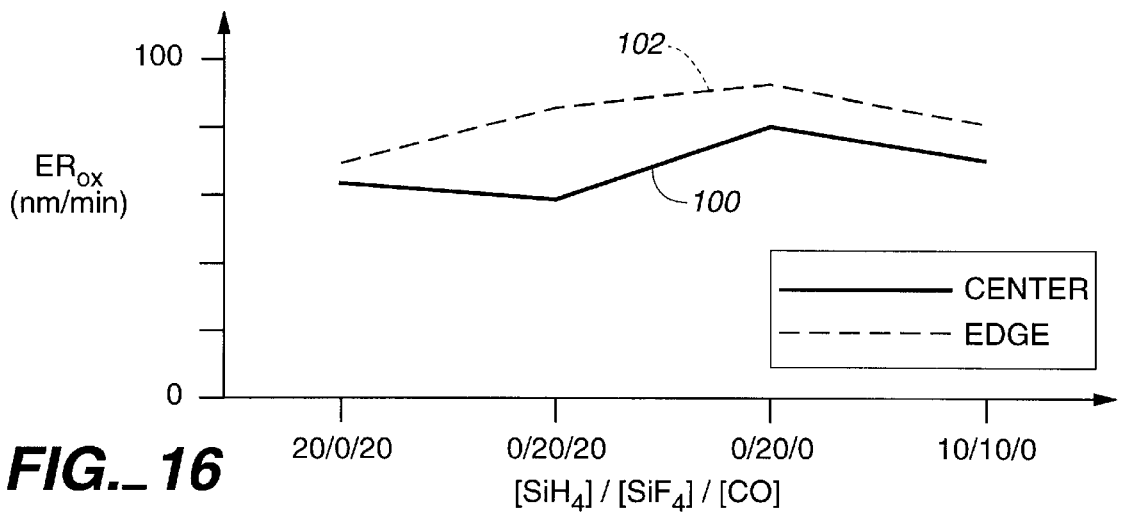
FIG._16
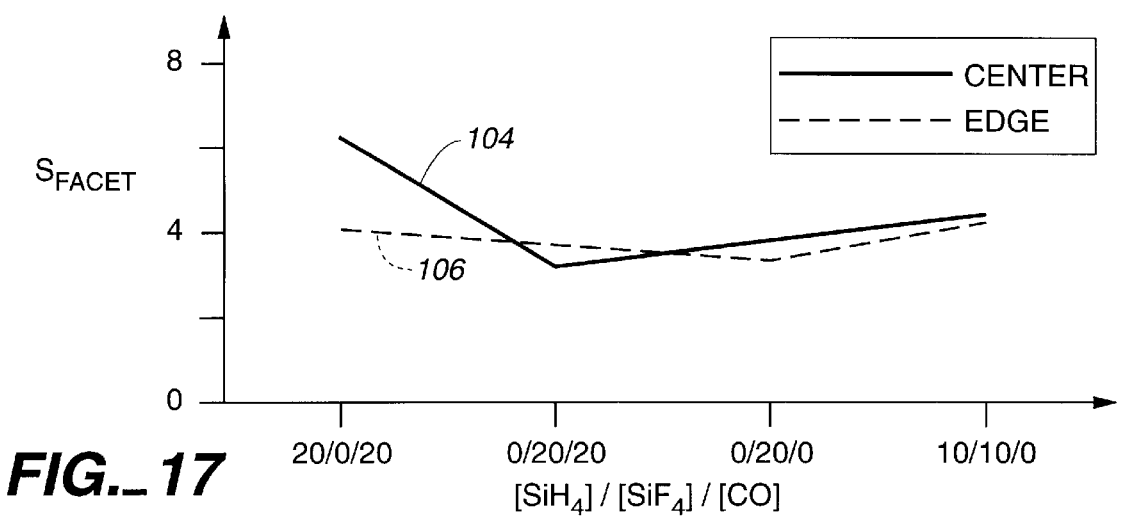
FIG._17
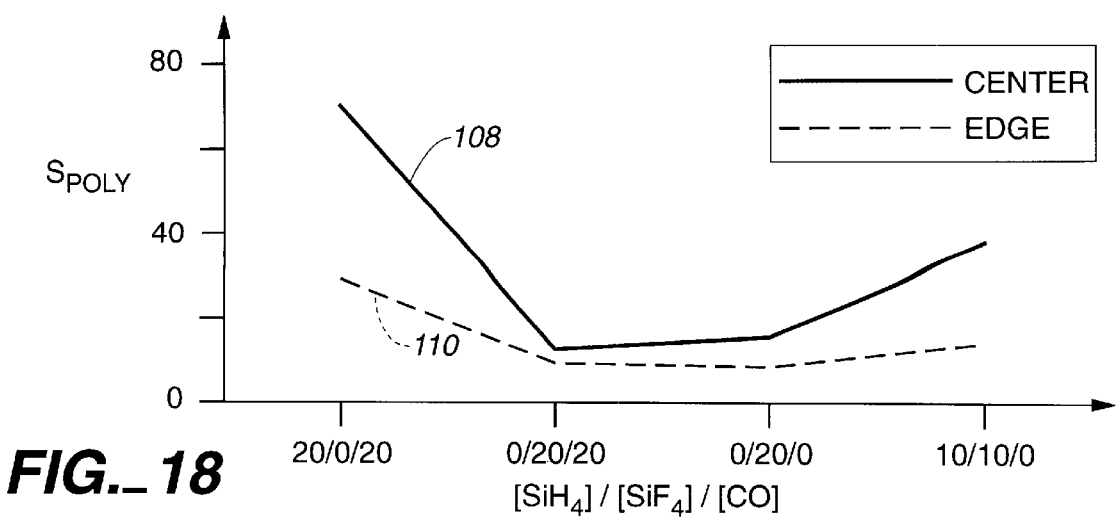
FIG._18

SILANE ETCHING PROCESS

FIELD OF THE INVENTION

The invention relates generally to plasma reactors and their operation. In particular, the invention relates to the plasma etching of semiconductors, and more particularly to oxide etching.

BACKGROUND ART

The level of integration in semiconductor integrated circuits continues to increase. The next generation of dynamic memories will have a capacity of 64 megabits and that of microprocessors will have upwards of ten million transistors. Further generations are being planned. These densities are obtainable only by the continuing shrinkage of feature sizes, now pushing towards 0.15 μm. However, layer thicknesses cannot similarly shrink because of physical effects such as dielectric breakdown and resistive losses. Hence, current designs call for features with high aspect ratios, that is, the ratio of the depth of a feature to its width. For example, a via electrically connects two levels of metallization through an intervening dielectric layer. Since the dielectric layer is constrained to a moderately large thickness because of dielectric breakdown thresholds, a dense circuit requires very narrow vias, and the resulting aspect ratios are three and higher. Etching high aspect ratio holes requires a highly anisotropic etch.

A further problem is that for economic reasons, the size of wafers being processed is increasing. Most current high-production equipment is designed for 200 mm wafers, and equipment is being designed for 300 mm wafers. Such large wafers impose stringent uniformity requirements on the etching process.

Some of the increased density is being achieved by using more complex integrated circuit structures, which however impose additional requirements upon the processing, particularly in etching. An example is the structure for a bi-level contact shown cross section in FIG. 1. A silicon substrate 10 includes unillustrated structure already formed therein that requires contacting from an upper level. A first oxide layer 12, for example, of plasma-deposited silicon dioxide, is formed over the silicon substrate 10. A relatively thin polysilicon interconnect 14 is deposited and defined over the first oxide layer 12, and a second oxide layer 16 is deposited over both the interconnect 14 and the first oxide layer 10. Thereafter, a single photolithographic etching step using a single photomask etches both a relatively shallow via hole 20 to the polysilicon interconnect 14 and a deeper substrate contact hole 22 to the silicon substrate 10. It is to be appreciated that a very similar process may be used where both of the holes are used to contact respective polysilicon interconnects on different levels.

The bi-level contact structure requires an etch process that is highly selective to silicon. That is, a process that selectively etches silicon oxide but etches silicon to a much less extent. If the selectivity is insufficiently high, the polysilicon interconnect 14 would be etched through while, under the same etching conditions, the thicker first oxide layer 12 is being etched through. Even in a less demanding structure, selectivity to silicon is greatly desired so that the oxide etch dependably stops on the underlying silicon to thus provide a wide process window for the etching. With poor selectivity, if the etch were performed for too short a time, the silicon would not be exposed, and if it were performed for too long a time relatively thin underlying silicon layers would be etched through. Process variables make a precisely timed etch difficult to implement commercially.

Oxide etch selectivity has been achieved in a plasma reactor with a fluorocarbon etching gas and a fluorine scavenger. A fluorocarbon as used in this application is a compound consisting only of carbon, fluorine, and possibly hydrogen. A hydrogen-free fluorocarbon consists only of carbon and fluorine. Examples of hydrogen-free fluorocarbon etching gases are $CF_4$, $C_2F_6$, $C_4F_8$. On the other hand, a hydrofluorocarbon compound also contains at least one carbon atom, for example, $CHF_3$. It is believed that under common conditions most fluorocarbon gases deposit a polymer on all surfaces. However, if the polymer has a sufficiently low fluorine content, oxygen in an underlying silica ($SiO_2$) layer reacts with the polymer to form volatile CO and $CO_2$. That is, the underlying silica prevents the polymer from being formed, and the silica is etched. On the other hand, an underlying layer of silicon (or silicon nitride, $Si_3N_4$) does not contain oxygen, and the polymer deposits faster than it is etched to thereby protect the underlying silicon layer from being etched. As a result, etching of the via and contact holes 20, 22 proceeds until silicon layers 14, 10 are reached, at which point etching stops or is substantially reduced.

The selectivity provided by the polymer depends, however, on the polymer having a relatively low fluorine content. Silicon is the most preferable of a number of materials known to scavenge fluorine from a fluorocarbon plasma. The silicon reacts with the fluorine radicals F* in the plasma, and any polymer resulting from the plasma then has a low fluorine content. Generally, however, the silicon requires some activation. Rice discloses thermal activation of the silicon in U.S. Pat. No. 5,477,975. It has been recognized that alternatively the silicon can be activated with RF biasing of the silicon electrode. See for example U.S. Pat. No. 5,556,501 to Collins et al. and European Patent Application 552,491-A1.

Schneider et al. in U.S. patent application Ser. No. 08/734,015, filed Oct. 18, 1996, incorporated herein by reference, address these many problems involved in oxide etching. Among several embodiments, they disclose the conically shaped plasma reactor 30 illustrated in cross section in FIG. 2. A wafer 32 is supported on a pedestal 34 that is preferably vertically movable with respect to a lower chamber body 36. A ring 37 surrounds the upper portion of the pedestal 34. In the examples described here, the ring 37 is composed of quartz and is left thermally floating. However, it is possible to form the ring 37 of silicon or silicon carbide and use it as a thermally activated fluorine scavenger. The heating can either rely upon the balance between plasma heating and active cooling or can rely upon, for example, controlled radiant heating of the silicon ring 37 if higher activation of the ring is desired.

An upper chamber assembly includes a conical dome 38 supported on the lower chamber body 36 through an electrical insulating joint including a plasma guard 40, a seal ring 42, and intervening support pads 44. Preferably, the conical dome is composed of an electrically insulating bulk body of sintered silicon carbide and an electrically conductive inner film of chemical vapor deposited (CVD) silicon carbide. Alternatively, the conical dome can be composed of high resistivity ($\rho > 20$ Ω-cm) polysilicon material. An RF inductive coil 46 supported in a coil carrier 48 is wrapped around the conical dome 38. The resistivities of the sintered and CVD silicon carbide portions of the conical dome 38 are chosen such that the RF magnetic field induced through the inductive coil 46 can pass through the dome 38 with minimal loss but the inner CVD film can be set to a predetermined electrical potential to provide a grounding plane.

An electrically insulating plasma guard 50 rests on the top inner rim of the conical dome 38 and in turn supports a roof 52. A vacuum O-ring or Vespel ring provides the electrical isolation. A center gas feed 54 is integrated with the roof 52 and supplies processing gas into the reactor 30 through unillustrated holes in the roof 52. Most of the remaining illustrated structure is involved with the temperature control of the conical dome 38 and the roof 52 and is fully described in the referenced patent application to Schneider et al. The roof thermal control includes a resistively heated plate 56 and a water-cooled chiller plate 57. The dome thermal control includes a resistively heated conical sheath 58 and a water-cooled collar 59.

The diameter of the exposed portions of the roof 52 is approximately equal to the diameter of the pedestal. That is, the two electrodes sandwiching the plasma have the same size.

For an oxide etcher, the roof 52 is preferably formed of an electrically conductive fluorine scavenger, examples of which are polysilicon, silicon carbide, and glassy carbon. Preferably, the conical dome 38 is formed of one of these same materials and has a conductivity sufficient to present an electrical grounding surface to the plasma. Typically, the etching gas is a fluorocarbon, and hexafluoro-ethane ($C_2F_6$) has been extensively tested in the illustrated reactor for oxide etching. When RF power, typically in the frequency range of 1 to 2 MHz, is applied both to the coil 46 and across the two electrodes formed by the pedestal 34 and the roof 52, a fluorocarbon plasma is excited in the reactor 30, including a processing space 56 above the wafer 32. The fluorine scavenger is made to contact the plasma and to remove a certain amount of fluorine from the plasma. Thereby, any polymer formed on the wafer 32 from the fluorocarbon plasma is deficient in fluorine. As is now well known, a low-fluorine polymer can produce a highly selective etch to silicon, for example, in the bi-level contact structure of FIG. 1. In this approach, the activation is accomplished with substantially no heating of the roof and dome.

It is now known that one way to activate the solid fluorine scavenger is to apply RF energy to it. That is, the roof 52 is not merely grounded, but a significant RF signal is applied to it. As is shown in U.S. patent application Ser. No. 08/804,430, filed Feb. 21, 1997 by Wu et al., the electrical circuit in this use is illustrated schematically in FIG. 4. The conical dome 38 is electrically grounded, and its surrounding coil 46 is powered by a first RF power supply 60. A power-splitting RF power supply 62 is coupled through two coupling capacitors 64, 66 to both the roof 52 and the pedestal 34. An example of a power-splitting RF power supply 62 is schematically illustrated in FIG. 4. A second RF power supply 66 supplies single-phase RF power to a power splitting circuit 68. For example, the RF power is applied to the primary of a wide-band transformer 70. The secondary of the transformer 72 has a number of taps, and a switch 72 selectively connects any one of these taps to a predetermined potential such as ground. Respective ends of the transformer secondary are connected through the coupling capacitors 64, 66 to the roof 52 and the pedestal 34. Dependent upon the setting of the transformer tap switch 72, varying amounts of RF power are split between the roof 52 and the pedestal 34. In the illustrated position at the midpoint of the transformer secondary (which is not a recommended position, a lower fraction of RF power delivered to the roof 52 being desired) and assuming equal sizes for the roof 52 and the pedestal 34, equal amounts of RF power are delivered to the roof 52 and the pedestal. On the other hand, if a tap at the roof end of the transformer secondary is switched to ground, then the roof 52 is AC grounded and no RF power is delivered to the roof 52. This is the mode of operation that has been used by Rice et al. when the silicon-based fluorine scavenger is thermally activated. Tap positions between these two extremes split different ratios of power with a majority of power going to the pedestal 34.

Silicon-based scavenging for fluorine in the presence of a fluorocarbon etchant has also been applied to achieve high selectivity of oxide etching to an underlying layer of silicon nitride. Marks et al. disclose in U.S. Pat. No. 5,423,945 high selectivity to nitride can be achieved by use of either a silicon counter electrode or using a silicon-containing gas such as silane, but they offer the solid and gaseous silicon sources as alternatives.

Collins et al. have described an alternative approach to fluorine scavenging in U.S. Pat. No. 5,556,501. In one of several embodiments, they combine a fluorocarbon etching gas, such as $C_2F_6$ or $CF_4$, with a fluorine-consuming silicon-containing additive gas, such as silane ($SiH_4$), tetraethylorthosilicate (TEOS), diethylsilane, or silicon tetrafluoride ($SiF_4$). They also recommend using a polymer-forming additive gas such as $CH_3F$ or $CHF_3$. The same patent and its second-generation continuation application Ser. No. 07/941,507, filed Sep. 9, 1992, published as European Patent Application 552,491-A1, also disclose a silicon counter electrode and even RF powering of that electrode. However, Collins et al. consider the solid silicon scavenger as an alternative to a gaseous fluorine scavenger. Similarly, Tatsumi in U.S. Pat. No. 5,312,518 discloses both a silicon wall for scavenging fluorine in a sulfur halide etch and also discusses a $C_4F_8$ etch, but he does not combine the two chemistries.

The power splitting discussed by Wu et al. provides good oxide selectivity at relatively lower temperatures, but it is desired to reduce the temperature even further, particularly to simplify the reactor design and lengthen the lifetime of temperature-sensitive parts such as O-rings. Also, RF activation of the solid silicon-based scavenger requires that an RF signal be applied to the roof, a further complication in the design and operation of the reactor.

SUMMARY OF THE INVENTION

The invention may be summarized as an etch process, particularly applicable to etching an oxide layer over another layer not containing oxygen, particularly a silicon layer. In the process, a fluorine-scavenging gas containing silicon and hydrogen is added to an etch gas containing fluorine and carbon. Preferably, the scavenging gas is a silane or a similar gas, and the etch gas is a fluorocarbon. In one aspect of the invention, the silane is used in combination with a solid fluorine scavenger, particularly as used as an electrode surrounding the plasma. In another aspect of the invention, the ratio of the flow rates of the fluorocarbon and the silane is controlled to lie within fairly narrow ranges so as to optimize the selectivities and other processing characterizations. Higher flow rates of these gases are preferred. Silicon tetrafluoride may be added, producing an increase in the oxide etch rate.

BRIEF DESCRIPTION OF THE DRAWINGS

FIG. 1 is cross-sectional view of a bi-level contact structure in a semiconductor integrated circuit.

FIG. 2 is a cross-sectional view of a plasma etch chamber usable with the invention.

FIG. 3 is a schematic representation of power splitting in the plasma reactor of FIG. 2.

FIG. 4 is an electrical schematic of the power splitting circuitry.

FIG. 5 is another cross-sectional view of a bi-level contact structure useful for defining important etching parameters.

FIGS. 6 and 7 are graphs of experimentally determined contours for oxide etch rate as a function of the silane and fluorocarbon flow rates.

FIGS. 8 and 9 are graphs of experimentally determined contours for polysilicon selectivity as a function of the silane and fluorocarbon flow rates.

FIGS. 10 and 11 are graphs of experimentally determined contours for facet selectivity as a function of the silane and fluorocarbon flow rates.

FIGS. 12 and 13 are graphs of experimentally determined contours for profile angle as a function of the silane and fluorocarbon flow rates.

FIG. 14 is a graph of the dependence of the oxide etch rate on the roof and dome temperatures using the silane etch process of the invention.

FIG. 15 is a graph of the dependence of the polysilicon and photoresist facet selectivities upon the roof and dome temperatures.

FIGS. 16, 17, and 18 are graphs showing respectively oxide etch rate, facet selectivity, and polysilicon selectivity for four different combinations of silane, silicon tetrafluoride, and carbon monoxide.

DETAILED DESCRIPTION OF THE PREFERRED EMBODIMENTS

The addition of silane to a fluorocarbon etching process, particularly for etching silicon oxide, provides several advantages. However, the ratio of the flows of the fluorocarbon and silane gases are preferably set within a narrow range, and the addition of the silane prompts other changes in the process compared to the conventional fluorocarbon etch process.

An oxide etch process to be applied to advanced integrated circuits needs to satisfy several severe and often conflicting requirements. For high throughput of wafers through expensive machinery, the oxide etch rate $ER_{OX}$ needs to be maintained at a fairly high value, for example, above 500 nm/min, although even higher etch rates would be desirable. For deep etches of structures having thin layers of underlying polysilicon and especially for advanced structures such as the bi-level contact of FIG. 1, the etch rate for oxide needs to be much higher than that for polysilicon. The ratio of the oxide etch rate $ER_{OX}$ to the polysilicon etch rate $ER_{POLY}$ is called the polysilicon selectivity $S_{POLY}$. For a highly dense integrated circuit, the vias and contact holes need to be closely spaced. This introduces two requirements. The oxide etching needs to be highly anisotropic to produce holes with nearly vertical walls. This can be expressed as the taper angle or contour profile of the etched holes, which should be nearly 90°.

Another requirement arises from the fact that the patterned photoresist has a finite etch rate and its etching is not completely anisotropic. As illustrated in the cross section of FIG. 5, the etching gas etches the photoresist 18 as well as the exposed oxide, although usually at a slower etching rate. Dotted line 80 shows the original top of the photoresist 18. However, the more important selectivity with respect to the photoresist accounts for the facets 82 that develop in the photoresist 18 just above the tops of the via and contact holes 20, 22. The original thickness of the photoresist is represented by $D_{PR}$, and the thickness of the photoresist 18 remaining below the facets 82 is represented by $D_{REM}$. The facet selectivity $S_{FACET}$ is the ratio of the oxide depth $D_{OX}$ to the loss of photoresist 18 at the bottom of the facets 70, that is, $$S_{FACET} = \frac{D_{OX}}{D_{PR} - D_{REM}}. \quad (1)$$

The facet selectivity needs to be kept high.

A further problem with large wafers is that there may be substantial variation in any of the above quantities between the center and the edge of the wafer leading to center-to-edge non-uniformities. Hence, both edge and center values need to be determined.

Experiment 1

One experimentally verified embodiment of the invention is practiced on the reactor of FIG. 2 having a conical dome 38 through which RF power is inductively coupled. Both the conical dome 38 and the roof 52 are formed of either polysilicon or silicon carbide and are electrically grounded. The fluorocarbon etching gas is ethyl hexafluoride ($C_2F_6$) to which is added mono silane ($SiH_4$). Gas flow rates should be normalized to a chamber volume of 20 liters.

In one comprehensive set of experiments, the amounts of $C_2F_6$ and $SiH_4$ were varied, the other operational parameters being held for the most part constant, to etch a series of wafers formed with a bi-level structure including two levels of TEOS-grown oxide and a thin polysilicon line between the oxide layer. In addition to the $C_2F_6$ and the $SiH_4$, the gas flows for the etching gas consisted of between 0 and 40 sccm of CO and, 450 sccm of Ar and the chamber pressure was held between 35 and 45 mTorr. The inductive coil was supplied with 2800W of RF source power. The pedestal holding the wafer was supplied with 1400W of RF biasing power and was water-chilled to 10° C. The silicon carbide roof was temperature controlled at an operating temperature within the range of 100 to 180° C., the higher temperature being preferred for the experiments. The silicon carbide conical dome was held at 150° C. The etching proceeded for 120 s.

After etching of a wafer, the oxide etch rate $ER_{OX}$, the polysilicon selectivity $S_{POLY}$, the facet selectivity $S_{FACET}$, and the profile angle were measured for the wafers at both the wafer center and the wafer edge. The data were then statistically analyzed to provide contour plots for the parameters at both the center and the edge as a function of the $C_2F_6$ and $SiH_4$ gas flow rates.

The oxide etch rate $ER_{OX}$ is shown at the wafer center in FIG. 6 and at the wafer edge in FIG. 7. The polysilicon selectivity $S_{POLY}$ is shown at the wafer center in FIG. 8 and at the wafer edge in FIG. 9. The facet selectivity $S_{FACET}$ is shown at the wafer center in FIG. 10 and at the wafer edge in FIG. 11. Finally, the profile angle is shown at the wafer center in FIG. 12 and at the wafer edge in FIG. 13. The pairs of graphs will be discussed separately.

In FIGS. 6 and 7 are shown contours 80 for the oxide etch rate $ER_{OX}$ at values of 300, 400, 500, and 600 nm/min. The generally linear correspondence for a given etch rate contour 80 between the silane and fluorocarbon flow rates show that the two gases strongly interact. The diagonal 82 of the graph seems to afford an optimum linear relationship between the silane and the $C_2F_6$. The linear relation between the two flow rates is represented as $$[SiH_4] = \tfrac{1}{2}([C_2F_6] - 20 \text{ sccm}). \quad (2)$$

The offset from strict proportionality is not understood and may be caused by the relatively few available experiment points. Proportionality lines 84 are given in FIGS. 6 and 7 for values of the flow ratio R of 2, 2.5, 3, 4, and 5, where R is defined as the ratio of the flow rates $$R = \frac{[C_2F_6]}{[SiH_4]}. \tag{3}$$

The etch rate data shows that the range of proportionality R between 2 and 5 offer generally better results, with the range between 2.5 and 4 offering even better results. However, as will be explained later, the higher fluorocarbon flow rates are preferred, and on the right side of FIG. 6, the most preferred range of proportionality R is between 2.5 and 3.

Turning now to the polysilicon selectivity $S_{POLY}$ shown in FIGS. 8 and 9, contours 86 are shown as a function of $C_2F_6$ and $SiH_4$ flow rates. The contours 86 are given for values for the polysilicon selectivity $S_{POLY}$ of 25, 50, 75, 100, 150, and 200 (a different set of contours are given in the two graphs). These results again show a strong interaction between the concentrations of the fluorocarbon and silane. The non-proportional linear relationship represented by the graph diagonal 82 seems to offer optimal characteristics. However, the areas bound by the lines 84 of proportionality R having respective pairs of bounding values between 2 and 5, 2.5 and 4, and 2.5 and 3 offer similar advantages to those areas of FIGS. 6 and 7. However, these contours 86 also indicate superior polysilicon selectivity when the flow rate for $C_2F_6$ is above 55 sccm and the flow rate for $SiH_4$ is above 15 sccm. Considering both the center and edge etch rates, flow rates for $C_2F_6$ above 70 sccm and for $SiH_4$ above 25 sccm together with a proportionality range of R between 2.5 and 3 seem to be optimal. However, also considering the center etch rate of FIG. 7, the $C_2F_6$ flow should be kept below about 100 sccm.

The contours 88 of the facet selectivity $S_{FACET}$ are given in FIGS. 10 and 11 for values of the selectivity of 2, 3, 4, 5, and 6. The contours 88 show a preference for much the same flow rates as those preferred for the polysilicon selectivity of FIGS. 8 and 9. However, the facet selectivity shows an even stronger preference for flow rates for $C_2F_6$ above 55 sccm and for $SiH_4$ above 15 sccm. The upper flow rate limits are also about the same.

The contours 90 of the profile angle are given in FIGS. 10 and 11 for values of the angle of 75°, 80°, 82.5°, 85°, and 87.5°. Not all values have contours in both figures. The data show that a more vertical profile is obtained for higher flow rates of $SiH_4$ and for lower flow rates of $C_2F_6$. Considered together with the other contours, the previously presented preferred ranges of flow rates produce acceptable profile angles of at least 80°, and the angles are beneficially increased for the higher flow rates of both $SiH_4$ and $C_2F_6$.

Experiment 2

Another set of experiments were performed with many of the same processing parameters as the first experiment, but the temperatures of the conical dome 38 and of the roof 52 were varied between the runs. Both the dome and roof were electrically grounded. Five combinations of wall and dome temperatures were tested as shown in TABLE 1.

TABLE 1

| RUN | Roof Temp. (° C.) | Wall Temp. (° C.) |
|---|---|---|
| 1 | 120 | 135 |
| 2 | 135 | 143 |
| 3 | 153 | 170 |
| 4 | 172 | 190 |
| 5 | 190 | 210 |

During the five runs, the flow rates of $C_2F_6$, $SiH_4$, and CO were maintained constant at 60 sccm, 20 sccm, and 20 sccm respectively. After fabrication, wafers from each run were sectioned, micrographed, and the etching characteristics were measured from the micrographs. In FIG. 14, curve 92 shows the oxide etch rate at the wafer center, and curve 93 shows it at the wafer edge. The oxide etch rate increases at lower temperatures, with the roof temperature being preferably no higher than 135° C. and the wall temperatures being preferably no higher than 143° C. In FIG. 14, curve 94 shows the polysilicon selectivity at the wafer center, and curve 95 shows it at the wafer edge. Also, curve 96 shows the photoresist facet selectivity at the wafer center, and curve 97 shows it at the wafer edge. These curves can be interpreted as the etching process favoring the combination of 135/143° C. and disfavoring the temperatures above 153/170° C. The contact hole profile was also measured. The unillustrated data favors temperatures of 153/170° C. and lower. At these temperatures, the profile angles were 87° and higher.

The above data are derived from experiments performed with a chamber having silicon or silicon carbide walls held at relatively low temperature and with no RF biasing on the silicon parts. That is, the silicon walls are not in great part activated to scavenge the fluorine. Hence, the major portion of the silicon-based fluorine scavenging is performed by the gaseous silane. An advantage of not relying of silicon-based walls for the fluorine scavenging is that they are not consumed during the etching process. Nonetheless, even with the use of silane scavenging, silicon walls are preferred. They are inherently compatible with a silicon wafer and do not greatly affect the etching chemistry absent some significant difference between the silicon wafer and the silicon wall. Further, the use of both solid and gaseous scavengers provides two independent controls over the etching process. The gaseous scavenger, at least in the regime reported above, dominates the scavenging, but the temperature control of the silicon electrode has been shown, with reference to FIGS. 14 and 15, to provide additional control over the scavenging. RF biasing of the silicon electrode can also provide this additional control. The two controls over the solid and gaseous scavengers can be traded off to achieve particularly good etching characteristics or to widen the process window, an important consideration in a production process.

Experiment 3

The above detailed results were derived for the fluorocarbon etchant being $C_2F_6$, but the invention can be extended to other fluorocarbon etching gases. Another set of experiments was performed using octafluoro-cyclobutane ($C_4F_8$) as the primary etching gas. The gas flow was 20 sccm of $C_4F_8$, 20 sccm of $CHF_3$, 10 sccm of $O_2$, 450 sccm of Ar, and varying amounts of $SiH_4$. The chamber was held at 30 mTorr. The hydrofluorocarbon $CHF_3$ is often considered to be a polymer-former. The RF power was the same as in the first example. The silicon carbide roof was held at 140° C.; and the polysilicon conical dome, at 150° C.

For the etching of a first wafer with no silane, the oxide etch rate is 667 nm/min, the polysilicon selectivity is 20 and the photoresist facet selectivity is 4. For the etching of a second wafer with a silane flow of 12 sccm, the oxide etch rate is reduced to 408 nm/nm, the polysilicon selectivity is increased to above the observable limit of 100, and the photoresist etch rate remains at 4. These results are consistent with the previously presented preferred ranges of flow rates of silane and fluorocarbon. These results also show the effectiveness of the combination of silane and another fluorocarbon in the bi-level process.

Silicon tetrafluoride ($SiF_4$) is a gas often associated with oxide etching. Our results show that $SiF_4$ affords faster oxide etching but poorer selectivity than $SiH_4$. However, we also have discovered that silane and silicon tetrafluoride can be combined for performance optimized for specific application.

Experiment 4

Another set of experiments were performed using generally the same conditions as the second experiment. The flow rate of $C_2F_6$ was 60 sccm, that of CO was 20 sccm, and that of Ar was 450 sccm. For a first wafer, the etching gas was augmented with 20 sccm of $SiF_4$. At the wafer edge, this produced an oxide etching rate of 860 nm/min, a polysilicon selectivity of 8.5, a photoresist facet selectivity of 3.5, and a profile angle of 85°. At the center, the profile angle was so small as to introduce questions of etch stopping. That is, the hole would stop being etched. For a second wafer, the $SiF_4$ was replaced by 20 sccm of $SiH_4$. At the wafer edge, the silane produced an oxide etch rate of 700 nm/min, a polysilicon selectivity of 30, a facet selectivity of 4.4, and a profile angle of 87°.

These results show that $SiF_4$ affords faster oxide etching rates, but $SiH_4$ affords better selectivity and anisotropy.

Experiment 5

In another set of experiments, the effect of adding silane to silicon tetrafluoride in a fluorocarbon etch was examined. The operational parameters were generally as presented for the second experiment. The flow of etching gas included 60 sccm of $C_2F_6$ and 450 sccm of Ar. The addition of 20 sccm of $SiF_4$ to the etching gas produced values at the wafer edge of an oxide etch rate of 930 nm/min, a polysilicon selectivity of 8.8, a photoresist selectivity of 3.5, and a profile angle of 86°. Alternatively, the additional of 10 sccm of $SiF_4$ and 10 sccm of $SiH_4$ to the etching gas produced values at the wafer edge of oxide etch rate of 820 nm/min, a polysilicon selectivity of 14.8, a facet selectivity of 4.4, and a profile angle of 88°. Thus, once again, the silane reduces the oxide etching rate but improves the other characteristics.

Experiment 6

Another set of experiments was performed which varied the relative flows of silane, silicon tetrafluoride, and carbon monoxide into the etch chamber. The flow rate of $C_2F_6$ was 60 sccm, and that of Ar was 450 sccm. For five different wafers, the flow rates of $SiH_4$, $SiF_4$, and CO were respectively in units of sccm (20/0/20), (0/20/20), (0/20/0), and (10/10/0). The other conditions were approximately those reported above.

The so determined oxide etching rates are shown for the wafer center by plot 100 in FIG. 16 and for the wafer edge by plot 102. As discussed before, replacing $SiH_4$ with $SiF_4$ increases the oxide etching rate.

The results for facet selectivity are shown in FIG. 17, plot 104 giving the center photoresist facet selectivity, and plot 106 giving the edge photoresist facet selectivity. The edge results are equivocal, but the center results show a clear advantage to silane over silicon tetrafluoride.

The results for polysilicon selectivity are shown in FIG. 18, plot 108 giving the center polysilicon selectivity, and plot 110 giving the edge results. Clearly, silane rather than silicon tetrafluoride provides advantageously high polysilicon selectivity, especially at the center. On the other hand, FIG. 16 clearly shows the etch-rate advantage of $SiF_4$ over $SiH_4$. Therefore, it becomes apparent that some combination of a fluorosilicon and silane can be selected to provide the best overall results among the many specified for an advanced integrated circuit.

Although the addition of silane to a fluorocarbon etch has many advantages, it also entails some operational drawbacks. It appears that silane produces a somewhat dirty process. As a result, if the chamber particle characteristics are to be maintained at a low level, it is required to clean a chamber using a silane etch more than if no silane were used. A post-etch plasma treatment (PET) with an oxygen plasma is often performed after the etching to remove any residual polymers and the like. It has been found that the inclusion of silane requires a significantly longer $O_2$ PET to maintain the chamber cleanliness than does a non-silane process, such as using only $C_4F_8$.

The oxygen post-etch treatment is preferably performed for a relatively long time, for example, 45 to 90 s, compared to the etch time with a relatively low bias power of, for example, 150W of RF power. The longer cleaning provides a cleaner chamber which provides a more reproducible process.

It has been found advantageous to perform a pre-etch step before the main silane and fluorocarbon etch step, especially in order to improve the photoresist facet selectivity. In the pre-etch step, a significantly reduced RF bias power is applied to the pedestal, for example, less than 20% or even 10% of the main bias power and possibly zero bias power, and the pre-etch treatment needs be applied only for a short time on the order of 5 s. The pre-etch treatment tends to improve the photoresist facet selectivity.

It is now known that scavenging of fluorine based on solid silicon is useful not only for a high polysilicon selectivity but also for a high silicon nitride selectivity relative to silicon oxide, as has been described by Marks et al. in the afore cited patent. Thus, many aspects of the invention are useful for etching through an oxide layer to an underlying silicon nitride layer. Indeed, the advantageous facet selectivity and profile tapering of the invention can be applied to structures in which the underlying material is not silicon or silicon nitride.

It is believed that further process control can be achieved by the combination of a silane scavenging gas and RF power splitting to a fluorine scavenging electrode, as described by Schneider et al. in the afore cited patent application.

The silane advantageously used with the process of the invention consists of silicon and hydrogen. Comparative experiments using only hydrogen in combination with a solid silicon scavenger produced distinctly inferior selectivity. Other silicon- and hydrogen-containing gases are expected to similarly enhance selectivity although processing windows should be established for any new combination of gases. Other such gases primarily based on silicon and hydrogen are disilane and TEOS.

The hydrogen-free fluorocarbon of the above experiments increases the oxide etch rate, and hydrogen-free fluorocarbons other than the disclosed $C_2F_6$ and $C_4F_8$ may be used, $CF_4$ being a popular oxide etchant. Hydrofluorocarbons, such as $CHF_3$, are well known etching gases and have been reported to provide increased selectivity. However, if the etching gas includes silane or a similar gas in combination with a hydrofluorocarbon, the etching process is more complex, and the dependencies of selectivity and etch rate upon the two flow rates are not so easy to separate. For this same reason, it is preferred that the silicon- and hydrogen-containing gases not contain fluorine or other halide. Experiments have been performed for establishing a process window with $SiH_4$ and $CHF_3$, just as was done in producing the results of FIGS. 6 through 13. The results with the hydrofluorocarbon were not so dramatic in favoring a particular range of flow ratios. Further, at least the preliminary results show poorer selectivity and uniformity than with the fluorocarbon. Nonetheless, a well controlled chamber may be optimized for a hydrofluorocarbon etch gas in combination with silane.

Although the etching gas of the invention is particularly advantageous when etching an oxide over silicon or a nitride, its use is not dependent upon the underlying material. Unless, there are other considerations, the inventive etching gas may be applied to other structures, such as etching through an oxide to a metal line for which polysilicon selectivity is not relevant.

The invention thus provides a high-performance etch of contact and via holes and similar structures with use of conventional gases. Further, the separation of selectivity enhancement and etch-rate enhancement provides an easy method of establishing a processing window.

What is claimed is:

1. A process for etching a substrate, comprising:
   placing said substrate within a plasma reactor chamber including a silicon-based scavenging surface exposed to a plasma within said chamber;
   admitting into said chamber a processing gas comprising a first gas comprising a silane and a second gas comprising fluorine and carbon in a ratio of flow rates between said hydrogen-free fluorocarbon and said silane lying with a range of between 2 and 5: and
   exciting said processing gas into said plasma to thereby etch said substrate whereby an oxide of said substrate is etched preferentially to an underlying material comprising silicon.

2. The process of claim 1, wherein said first gas comprises monosilane.

3. The process of claim 1, wherein said processing gas additionally comprises $SiF_4$.

4. The process of claim 1, wherein said second gas comprises a hydrogen-free fluorocarbon.

5. The process of claim 1, wherein said fluorocarbon comprises $C_2F_6$.

6. The process of claim 1, wherein said fluorocarbon comprises $C_4F_8$.

7. The process of claim 1, wherein said range extends between 2.5 and 4.

8. The process of claim 7, wherein said range extends between 2.5 and 3.

9. The process of claim 8, wherein said flow rate of said fluorocarbon is greater than 55 sccm normalized to a 20 liter chamber.

10. The process of claim 1, wherein said admitting steps flows said fluorocarbon into said chamber at a flow rate of greater than 55 sccm normalized to a 20 liter chamber.

11. The process of claim 1, further comprising controlling a temperature of said silicon-based scavenging surface to an operating temperature of no more than 200° C.

12. The process of claim 11, wherein said operating temperature is less than 150° C.

13. A process for etching a substrate, comprising:
    placing s aid substrate within a plasma reactor chamber;
    admitting into said chamber a processing gas comprising a hydrogen-free fluorocarbon gas and a silane gas in a ratio of flow rates between said fluorocarbon gas and said silane gas lying within a range of between 2 and 5; and
    exciting said processing gas within said plasma reactor chamber into a plasma to etch said substrate.

14. The process of claim 13, wherein said range extends between 2.5 and 4.

15. The process of claim 14, wherein said range extends between 2.5 and 3.

16. The process of claim 15, wherein said flow rate of said fluorocarbon gas is greater than 55 sccm normalized to a 20 liter chamber.

17. The process of claim 13, wherein said flow rate of said fluorocarbon gas is greater than 55 sccm normalized to a 20 liter chamber.

18. The process of claim 13, further comprising maintaining all walls of said chamber at an operating temperature of no more than 200° C.

19. The process of claim 18, wherein said operating temperature is less than 150° C.

20. The process of claim 19, wherein said wall comprise at least a portion having a composition selected from silicon and silicon carbide.

21. The process of claim 13, wherein said substrate comprises a first layer comprising silicon oxide overlying a second layer comprising essentially silicon, wherein said processing gas preferentially etches said silicon oxide over said silicon.

22. A process of etching an oxide layer, comprising the steps of:
    positioning a substrate having an silicon oxide layer formed thereon within a plasma reactor chamber;
    flowing into said chamber an etching gas comprising silane, silicon tetrafluoride, and a fluorocarbon; and
    exciting said etching gas into a plasma to thereby etch said substrate.

23. The process of claim 22, wherein said fluorocarbon is a hydrogen-free fluorocarbon.

24. The process of claim 23, wherein said flowing step flows said silane and said fluorocarbon into said chamber at respective flow rates in a ratio of between 2 and 5.

25. A process of optimized etching of an oxide layer, comprising the steps of:
    positioning a series of substrates having an silicon oxide layer formed thereon within a plasma reactor chamber;
    for each of said substrates flowing into said chamber an etching gas formed at least in part by a respective combination of a first flow rate of silane and a second flow rate of a fluorocarbon, said combinations of first and second flow rates differing between said substrates;
    exciting said etching gas into a plasma to thereby etch said each substrate;
    measuring for each of said substrates a respective oxide etching rate and a selectivity of etching silicon oxide over polysilicon;
    determining a preferred range of ratios of first and second flow rates from said measured oxide etching rates and said measured selectivities; and determining a minimum flow rate of one of said first and second flow rates from said measured selectivities.

26. The process of claim 25, further comprising etching a plurality of substrates while flowing into said chamber said etching gas formed according to respective first and second values of said first and second flow rates having ratios within said preferred range and conforming to said minimum flow rate of said one of said first and second flow rates.

* * * * *